United States Patent
Yanagisawa

(10) Patent No.: US 7,940,042 B2
(45) Date of Patent: May 10, 2011

(54) METHOD AND APPARATUS FOR TESTING MAGNETORESISTIVE EFFECT ELEMENT

(75) Inventor: Takumi Yanagisawa, Tokyo (JP)

(73) Assignee: TDK Corporation, Tokyo (JP)

( * ) Notice: Subject to any disclaimer, the term of this patent is extended or adjusted under 35 U.S.C. 154(b) by 309 days.

(21) Appl. No.: 12/349,891

(22) Filed: Jan. 7, 2009

(65) Prior Publication Data

US 2010/0171494 A1 Jul. 8, 2010

(51) Int. Cl.
*G01R 33/12* (2006.01)
*G01R 31/02* (2006.01)

(52) U.S. Cl. .......... 324/252; 324/207.21; 324/202; 324/210; 324/117 R; 702/115; 360/314; 360/324

(58) Field of Classification Search .......... 324/252, 324/202, 210; 360/313–314, 324
See application file for complete search history.

(56) References Cited

U.S. PATENT DOCUMENTS

| | | | | |
|---|---|---|---|---|
| 5,517,111 | A | * | 5/1996 | Shelor .......... 324/235 |
| 6,081,114 | A | * | 6/2000 | Shimazawa et al. .......... 324/210 |
| 6,433,540 | B1 | * | 8/2002 | Hachisuka et al. .......... 324/210 |
| 2006/0132121 | A1 | * | 6/2006 | Grimm .......... 324/209 |

FOREIGN PATENT DOCUMENTS

| | | |
|---|---|---|
| JP | 2006-190838 | 7/2006 |
| JP | 2007-150265 | 6/2007 |
| JP | 2007-242092 | 9/2007 |

OTHER PUBLICATIONS

Klaas B. Klaassen, et al. "Broad-Band Noise Spectroscopy of Giant Magnetoresistive Read Heads", IEEE Transactions on Magnetics, vol. 41, No. 7, Jul. 2005, pp. 2307 to 2317.

\* cited by examiner

*Primary Examiner* — Ha Tran T Nguyen
*Assistant Examiner* — Emily Y Chan
(74) *Attorney, Agent, or Firm* — Frommer Lawrence & Haug LLP

(57) ABSTRACT

A method for testing an MR element includes a step of obtaining a ferromagnetic resonance frequency $f_0$ of the MR element to be tested by applying an external magnetic field in a track-width direction to the MR element, a step of calculating a stiffness magnetic field $H_{stiff}$ from the obtained ferromagnetic resonance frequency $f_0$ using a predetermined formula, a step of obtaining a relationship of a stiffness magnetic field $H_{stiff}$ with respect to an external magnetic field applied in the track-width direction from the applied external magnetic field and the calculated stiffness magnetic field $H_{stiff}$, a step of obtaining a uniaxial anisotropic magnetic field $H_k$ of a free layer of the MR element from the obtained relationship of the stiffness magnetic field $H_{stiff}$ with respect to the external magnetic field applied, and a step of judging whether the MR element is good product or not by comparing the obtained uniaxial anisotropic magnetic field $H_k$ with a predetermined threshold.

16 Claims, 8 Drawing Sheets

METHOD AND APPARATUS FOR TESTING MAGNETORESISTIVE EFFECT ELEMENT

BACKGROUND OF THE INVENTION

1. Field of the Invention

The present invention relates to a method and apparatus for testing a magnetoresistive effect (MR) element used for a read head element of a thin-film magnetic head or for a magnetic memory.

2. Description of the Related Art

Recently, a lot of MR elements each having a multi-layered structure, such as giant magnetoresistive effect (GMR) elements or tunnel magnetoresistive effect (TMR) elements, are utilized as read head elements of thin-film magnetic heads in high recording density disk drive apparatus or as magnetic memories.

In general, each MR element with the multi-layered structure has a spacer layer or a tunnel barrier layer, a free layer and a pinned layer that sandwich the spacer layer or the tunnel barrier layer, a pinning layer for fixing a magnetization direction of the pinned layer, and domain control layers located at both side ends of the free layer in the track-width direction, for producing bias magnetic field that controls magnetic domain of the free layer.

In such multi-layered MR element, it was quite difficult to actually measure a uniaxial anisotropic magnetic field $H_k$ of the free layer. This is because, to a free layer of a fabricated MR element, a bias magnetic field is always applied from magnetic domain control layers and thus the uniaxial anisotropic magnetic field $H_k$ of the free layer will be disappeared from measurement by the bias magnetic field.

Because of this reason, any screening process in which a uniaxial anisotropic magnetic field $H_k$ of the free layer is measured and whether the fabricated MR element is good product or not is judged depending upon the measured uniaxial anisotropic magnetic field $H_k$ has been hardly performed.

SUMMARY OF THE INVENTION

It is therefore an object of the present invention to provide a new testing method and apparatus for an MR element, whereby it is possible to measure a uniaxial anisotropic magnetic field $H_k$ of the free layer and to evaluate the MR element depending upon the measured uniaxial anisotropic magnetic field $H_k$.

According to the present invention, a method for testing an MR element includes a step of obtaining a ferromagnetic resonance frequency $f_0$ of the MR element to be tested by applying an external magnetic field in a track-width direction to the MR element, a step of calculating a stiffness magnetic field $H_{stiff}$ from the obtained ferromagnetic resonance frequency $f_0$ using a predetermined formula, a step of obtaining a relationship of a stiffness magnetic field $H_{stiff}$ with respect to an external magnetic field applied in the track-width direction from the applied external magnetic field and the calculated stiffness magnetic field $H_{stiff}$, a step of obtaining a uniaxial anisotropic magnetic field $H_k$ of a free layer of the MR element from the obtained relationship of the stiffness magnetic field $H_{stiff}$ with respect to the external magnetic field applied, and a step of judging whether the MR element is good product or not by comparing the obtained uniaxial anisotropic magnetic field $H_k$ with a predetermined threshold.

A ferromagnetic resonance frequency $f_0$ of the MR element to be tested is obtained by applying an external magnetic field in a track-width direction to the MR element, a stiffness magnetic field $H_{stiff}$ is calculated from the obtained $f_0$ using a theoretical formula between $f_0$ and $H_{stiff}$, a relationship of a stiffness magnetic field $H_{stiff}$ with respect to an external magnetic field applied in the track-width direction is obtained from the applied external magnetic field and the calculated stiffness magnetic field $H_{stiff}$, a uniaxial anisotropic magnetic field $H_k$ is obtained from the obtained relationship, and whether the MR element is good product or not is judged by comparing the obtained $H_k$ with a predetermined threshold. Thus, according to the present invention, a uniaxial anisotropic magnetic field $H_k$ of the free layer, which cannot be usually watched due to the presence of the magnetic domain control bias magnetic field, can be easily derived. This uniaxial anisotropic magnetic field $H_k$ corresponds to a sum of an inverse magnetostrictive effect by the stress to the free layer and an induced magnetic anisotropy of the free layer material. Thus, an anisotropy of the MR element with a large $H_k$ may greatly change depending upon its stress change and its temperature changes, that is, characteristic change in such MR element depending upon its environmental change may be large. According to the testing method of the present invention, therefore, it is possible to identify an MR element producing noise in response to its environmental variation and having a factor of the device characteristic deterioration can be easily identified, and can be screened.

It is preferred that the step of obtaining a ferromagnetic resonance frequency $f_0$ includes obtaining output versus frequency characteristics of the MR element and determining the ferromagnetic resonance frequency $f_0$ as a frequency at which the obtained output versus frequency characteristics becomes the maximum value.

It is also preferred that the step of calculating a stiffness magnetic field $H_{stiff}$ includes calculating the stiffness magnetic field $H_{stiff}$ using a mathematical formula, $$f_0 = \frac{\gamma}{2\pi}\sqrt{M_s H_{stiff}}$$

where $f_0$ is a ferromagnetic resonance frequency, $\gamma$ is a gyromagnetic constant, and $M_s$ is a magnetic free moment (saturated magnetization) of the free layer, which is determined depending upon a shape of a junction and a thickness of the free layer.

It is further preferred that the step of obtaining a relationship of a stiffness magnetic field $H_{stiff}$ with respect to an external magnetic field applied includes changing the external magnetic field applied to the MR element, and obtaining the ferromagnetic resonance frequency $f_0$ at every time the external magnetic field applied being changed.

It is still further preferred that the step of obtaining a relationship of a stiffness magnetic field $H_{stiff}$ with respect to an external magnetic field applied includes changing the external magnetic field applied to the MR element, and not only obtaining the ferromagnetic resonance frequency $f_0$ but also calculating the stiffness magnetic field $H_{stiff}$ at every time the external magnetic field applied being changed.

It is further preferred that the step of obtaining a uniaxial anisotropic magnetic field $H_k$ includes obtaining a first approximate line from a linear part of the relationship of the stiffness magnetic field $H_{stiff}$ with respect to the external magnetic field applied when the external magnetic field applied directs the same direction as that of a bias magnetic field for magnetic domain control, obtaining a second approximate line from a linear part of the relationship of the stiffness magnetic field $H_{stiff}$ with respect to the external magnetic field applied when the external magnetic field applied directs the opposite direction as that of the bias magnetic field for magnetic domain control, and obtaining the uniaxial anisotropic magnetic field $H_k$ from an intersecting point of the obtained first and second approximate lines.

It is still further preferred that the step of obtaining a uniaxial anisotropic magnetic field $H_k$ includes obtaining the uniaxial anisotropic magnetic field $H_k$ from a value of $H_{stiff}$ at an intersecting point of a formula of $H_{stiff}=H_k-H_{HB}-H_{ap(x)}$ under a condition in which the free layer is magnetically saturated in the same direction as that of a magnetic domain control bias magnetic field $H_{HB}$, and a formula of $H_{stiff}=H_k+H_{HB}+H_{ap(x)}$ under a condition in which the free layer is magnetically saturated in the opposite direction with respect to that of the magnetic domain control bias magnetic field $H_{HB}$, where $H_{ap(x)}$ is an applied magnetic field component in a direction along the free layer.

It is further preferred that the step of judging includes judging that the MR element is good product when the obtained uniaxial anisotropic magnetic field $H_k$ is equal to or less than the predetermined threshold.

According to the present invention, also, an apparatus for testing an MR element, includes a unit for obtaining a ferromagnetic resonance frequency $f_0$ of the MR element to be tested by applying an external magnetic field in a track-width direction to the MR element, a unit for calculating a stiffness magnetic field $H_{stiff}$ from the obtained ferromagnetic resonance frequency $f_0$ using a predetermined formula, a unit for obtaining a relationship of a stiffness magnetic field $H_{stiff}$ with respect to an external magnetic field applied in the track-width direction from the applied external magnetic field and the calculated stiffness magnetic field $H_{stiff}$, a unit for obtaining a uniaxial anisotropic magnetic field $H_k$ of a free layer of the MR element from the obtained relationship of the stiffness magnetic field $H_{stiff}$ with respect to the external magnetic field applied, and a unit for judging whether the MR element is good product or not by comparing the obtained uniaxial anisotropic magnetic field $H_k$ with a predetermined threshold.

A ferromagnetic resonance frequency $f_0$ of the MR element to be tested is obtained by applying an external magnetic field in a track-width direction to the MR element, a stiffness magnetic field $H_{stiff}$ is calculated from the obtained $f_0$ using a theoretical formula between $f_0$ and $H_{stiff}$, a relationship of a stiffness magnetic field $H_{stiff}$ with respect to an external magnetic field applied in the track-width direction is obtained from the applied external magnetic field and the calculated stiffness magnetic field $H_{stiff}$, a uniaxial anisotropic magnetic field $H_k$ is obtained from the obtained relationship, and whether the MR element is good product or not is judged by comparing the obtained $H_k$ with a predetermined threshold. Thus, according to the present invention, a uniaxial anisotropic magnetic field $H_k$ of the free layer, which cannot be usually watched due to the presence of the magnetic domain control bias magnetic field, can be easily derived. This uniaxial anisotropic magnetic field $H_k$ corresponds to a sum of an inverse magnetostrictive effect by the stress to the free layer and an induced magnetic anisotropy of the free layer material. Thus, an anisotropy of the MR element with a large $H_k$ may greatly change depending upon its stress change and its temperature changes, that is, characteristic change in such MR element depending upon its environmental change may be large. According to the testing method of the present invention, therefore, it is possible to identify an MR element producing noise in response to its environmental variation and having a factor of the device characteristic deterioration can be easily identified, and can be screened.

It is preferred that the unit for obtaining a ferromagnetic resonance frequency $f_0$ includes a unit for obtaining output versus frequency characteristics of the MR element and a unit for determining the ferromagnetic resonance frequency $f_0$ as a frequency at which the obtained output versus frequency characteristics becomes the maximum value.

It is also preferred that the unit for calculating a stiffness magnetic field $H_{stiff}$ includes a unit for calculating the stiffness magnetic field $H_{stiff}$ using a mathematical formula, $$f_0 = \frac{\gamma}{2\pi}\sqrt{M_s H_{stiff}}$$

where $f_0$ is a ferromagnetic resonance frequency, $\gamma$ is a gyromagnetic constant, and $M_s$ is a magnetic free moment (saturated magnetization) of the free layer, which is determined depending upon a shape of a junction and a thickness of the free layer.

It is further preferred that the unit for obtaining a relationship of a stiffness magnetic field $H_{stiff}$ with respect to an external magnetic field applied includes a unit for changing the external magnetic field applied to the MR element, and a unit for obtaining the ferromagnetic resonance frequency $f_0$ at every time the external magnetic field applied being changed.

It is still further preferred that the unit for obtaining a relationship of a stiffness magnetic field $H_{stiff}$ with respect to an external magnetic field applied includes a unit for changing the external magnetic field applied to the MR element, and a unit for not only obtaining the ferromagnetic resonance frequency $f_0$ but also calculating the stiffness magnetic field $H_{stiff}$, at every time the external magnetic field applied being changed.

It is further preferred that the unit for obtaining a uniaxial anisotropic magnetic field $H_k$ includes a unit for obtaining a first approximate line from a linear part of the relationship of the stiffness magnetic field $H_{stiff}$ with respect to the external magnetic field applied when the external magnetic field applied directs the same direction as that of a bias magnetic field for magnetic domain control, a unit for obtaining a second approximate line from a linear part of the relationship of the stiffness magnetic field $H_{stiff}$ with respect to the external magnetic field applied when the external magnetic field applied directs the opposite direction as that of the bias magnetic field for magnetic domain control, and a unit for obtaining the uniaxial anisotropic magnetic field $H_k$ from an intersecting point of the obtained first and second approximate lines.

It is still further preferred that the unit for obtaining a uniaxial anisotropic magnetic field $H_k$ includes a unit for obtaining the uniaxial anisotropic magnetic field $H_k$ from a value of $H_{stiff}$ at an intersecting point of a formula of $H_{stiff}=H_k-H_{HB}-H_{ap(x)}$ under a condition in which the free layer is magnetically saturated in the same direction as that of a magnetic domain control bias magnetic field $H_{HB}$, and a formula of $H_{stiff}=H_k+H_{HB}+H_{ap(x)}$ under a condition in which the free layer is magnetically saturated in the opposite direction with respect to that of the magnetic domain control bias magnetic field $H_{HB}$, where $H_{ap(x)}$ is an applied magnetic field component in a direction along the free layer.

It is further preferred that the unit for judging includes a unit for judging that the MR element is good product when the obtained uniaxial anisotropic magnetic field $H_k$ is equal to or less than the predetermined threshold.

Further objects and advantages of the present invention will be apparent from the following description of the preferred embodiments of the invention as illustrated in the accompanying drawings.

DESCRIPTION OF THE PREFERRED EMBODIMENTS

Figure 1:
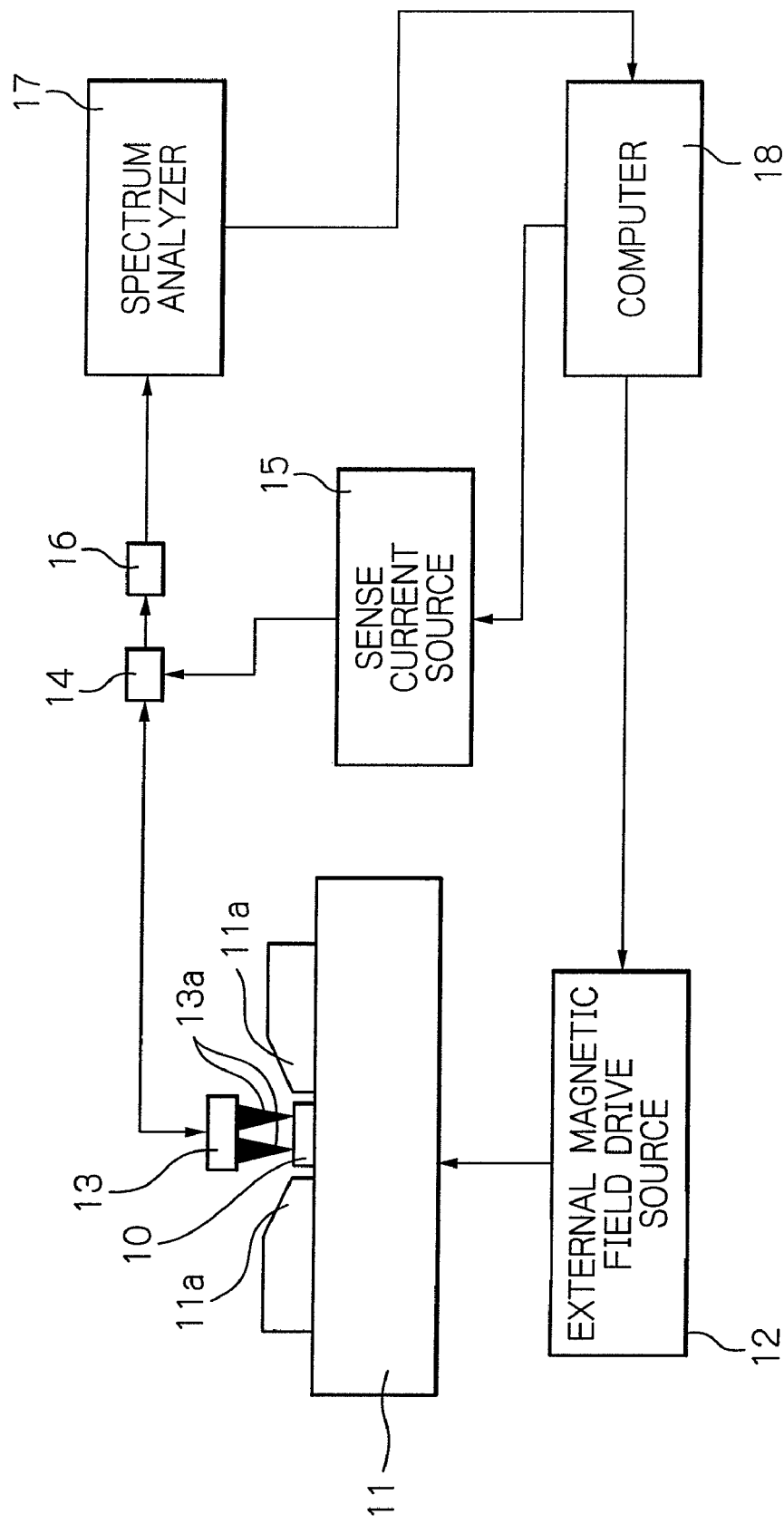
FIG. 1 is a block diagram schematically illustrating a testing apparatus of a thin-film magnetic head as an embodiment according to the present invention.

FIG. 1 schematically illustrates a testing apparatus of a thin-film magnetic head as an embodiment according to the present invention.

In the figure, reference numeral 10 denotes a thin-film magnetic head with a TMR read head element to be tested, 11 denotes an external magnetic field application device for applying an external magnetic field in the track-width direction to the thin-film magnetic head 10, 12 denotes an external magnetic field drive source for supplying a drive current with a variable amplitude to the external magnetic field application device 11, 13 denotes a probe device for bringing probes 13a into contact with electrode terminals of the TMR read head element of the thin-film magnetic head 10 so as to make electrical conduction with the TMR read head element, 14 denotes a branch circuit such as a bias T electrically connected to the probe device 13, 15 denotes a sense current source electrically connected to the probe device 13 through the branch circuit 14, for providing a sense current, 16 denotes an amplifier electrically connected to the probe device 13 through the branch circuit 14, capable of amplifying a high frequency signal of at least 10 GHz with low noise, 17 denotes a spectrum analyzer electrically connected to the probe device 13 through the amplifier 16 and the branch circuit 14, capable of measuring output versus frequency characteristics of the high frequency signal of at least 10 GHz, and 18 denotes a computer electrically connected to the external magnetic field drive source 12, the sense current source 15 and spectrum analyzer 17, respectively. The computer 18 controls operations of the external magnetic field drive source 12 and the sense current source 15, and also performs a testing procedure according to this embodiment in response to an output received from the spectrum analyzer 17.

The external magnetic field application device 11 has a toroidal core (not shown) around which a coil (not shown) is wound and poles 11a of the toroidal core. Between the poles 11a of the toroidal core, the thin-film magnetic head 10 or a row bar with a plurality of thin-film magnetic heads sequentially aligned are mounted so that an external magnetic field in the track-width direction is applied through the poles 11a to the thin-film magnetic head 10. The intensity of the external magnetic field depends on the amplitude of the drive current supplied form the external magnetic field drive source 12.

Figure 2:
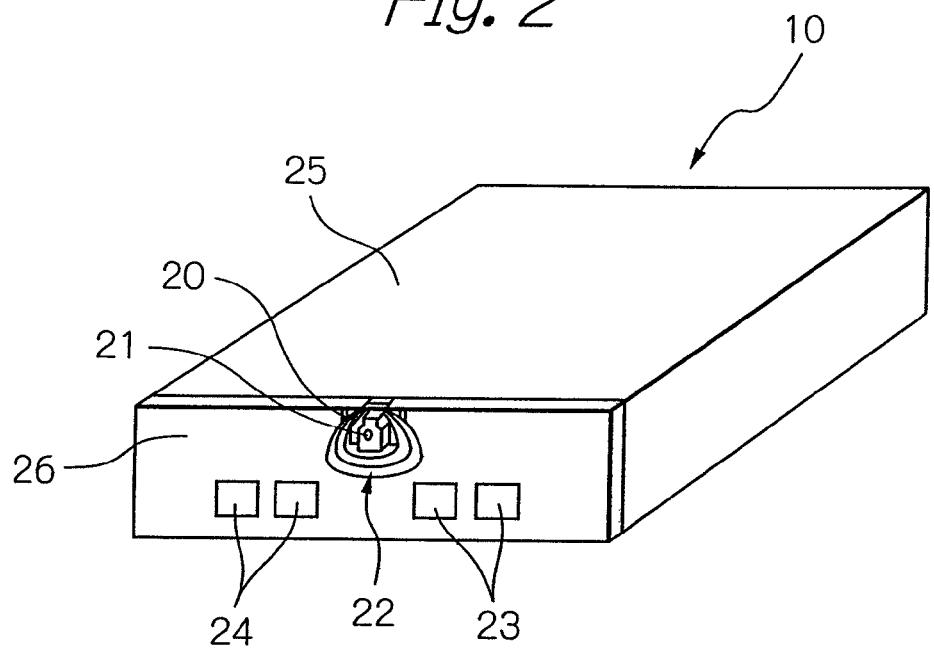
FIG. 2 is a perspective view illustrating a contour of an example of the thin-film magnetic head tested in the embodiment shown in FIG. 1.

FIG. 2 illustrates a contour of an example of the thin-film magnetic head tested in this embodiment.

As shown in the figure, the thin-film magnetic head 10 tested includes a composite magnetic head element 22 and four signal terminal electrodes 23 and 24, on an element formed surface 26 that is one side surface when an air bearing surface (ABS) 25 of the magnetic head slider serves as the bottom surface. The composite magnetic head element 22 includes a TMR read head element 20 and an inductive write head element 21 that are mutually stacked. The four signal terminal electrodes 23 and 24 are connected to the TMR read head element 20 and the inductive write head element 21.

Figure 3:
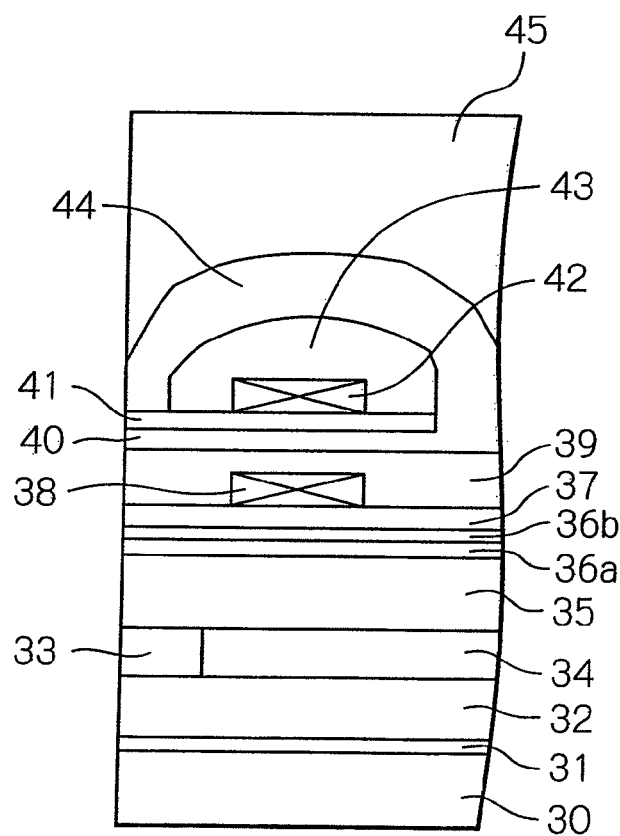
FIG. 3 is a central sectional view schematically illustrating a structure of the thin-film magnetic head shown in FIG. 2.
Figure 4:
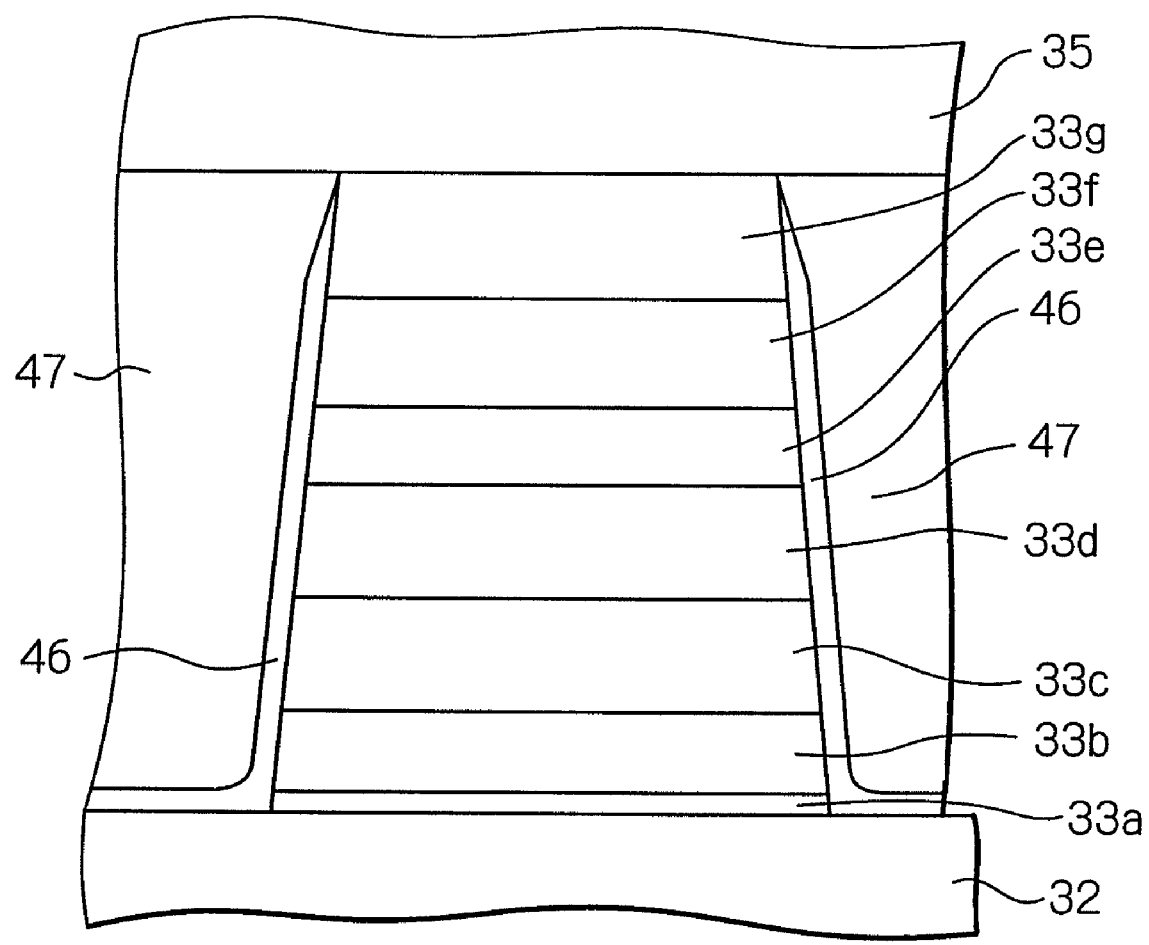
FIG. 4 is a sectional view schematically illustrating a structure of a TMR read head element of the thin-film magnetic head shown in FIG. 2.

FIG. 3 schematically illustrates the structure of the thin-film magnetic head in this embodiment, and FIG. 4 schematically illustrates the structure of the TMR read head element part of the thin-film magnetic head. In this embodiment, the MR read head element consists of a TMR read head element. However, in modifications, it may be formed by a GMR read head element. As is known, the GMR read head element has fundamentally the similar structure as the TMR read head element except for the former has a nonmagnetic conductive layer instead of a tunnel barrier layer. Also, in this embodiment, the inductive write head element is a write head element with a perpendicular magnetic recording structure. However, in modifications, it may be formed by an inductive write head element with an in-plane or horizontal magnetic recording structure.

The ABS 25 facing the surface of the magnetic disk in operation is formed on a substrate 30. An under insulation layer 31 is stacked on the substrate 30. A lower electrode layer 32 also serving as a lower shield layer is stacked on the under insulation layer 31. A TMR multi-layer 33 and an insulation layer 34 are stacked on the lower electrode layer 32. The TMR multi-layer 33 has, as will be described in detail later with reference to FIG. 4, a multi-layered structure of a lower metal layer 33a, an element under layer 33b, a pinning layer 33c made of an anti-ferromagnetic material, a pinned layer 33d, a tunnel barrier layer 33e, a free layer 33f and a cap layer 33g. Insulation layers 46 and hard bias layers 47 (not shown in FIG. 3 but shown in FIG. 4) to produce bias magnetic fields for controlling magnetic domain in the free layer are stacked on both side surfaces of this TMR multi-layer 33. An upper electrode layer 35 also serving as an upper shield layer is stacked on the TMR multi-layer 33 and the insulation layer 34.

The TMR read head element is basically composed of the lower electrode layer 32, the TMR multi-layer 33, the insulation layer 34, the upper electrode layer 35 and the hard bias layers.

One the TMR multi-layer 33, an insulation layer 36a and a soft magnetic layer 36b are stacked. On the insulation layer 36a and the soft magnetic layer 36b, stacked is an inductive write head element. The inductive write head element includes an insulation layer 37, a baking coil layer 38, a backing coil insulation layer 39, a main magnetic pole layer 40, an insulation gap layer 41, a write coil layer 42, a write coil insulation layer 43 and an auxiliary magnetic pole layer 44. A protection layer 45 is stacked on the inductive write head element.

The structure of the TMR read head element part in this embodiment will now be described with reference to FIG. 4. Namely, on the lower electrode layer 32, the lower metal layer 33a and the element under layer 33b are stacked in this order from the bottom, and the pinning layer 33c made of an anti-ferromagnetic material is stacked thereon. On the pinning layer 33c, the pinned layer 33d with a synthetic structure is stacked. The pinned layer 33d is formed by sequentially stacking an outer pinned layer, a nonmagnetic intermediate layer and an inner pinned layer. The magnetization direction of the outer-pinned layer is fixed by the anti-ferromagnetic coupling with the pinning layer 33c.

The tunnel barrier layer 33e is stacked on the inner-pinned layer. The free layer 33f with a two-layered structure of a high polarizability film and a soft magnetic film is stacked on the tunnel barrier layer 33e. The cap layer 33g is stacked on the free layer 33f, and the upper electrode layer 35 is stacked on the cap layer 33g.

The insulation layers 46 are stacked on the both side surfaces in the track-width direction of the TMR multi-layer 33. On the insulation layer 46, the hard bias layers 47 made of a hard magnetic material are stacked. These hard bias layers 47 are formed to produce bias magnetic fields for controlling magnetic domain in the free layer 33f. Instead of the hard bias layer, a multi-layered structure of a soft magnetic layer and an anti-ferromagnetic layer may be used.

Figure 5:
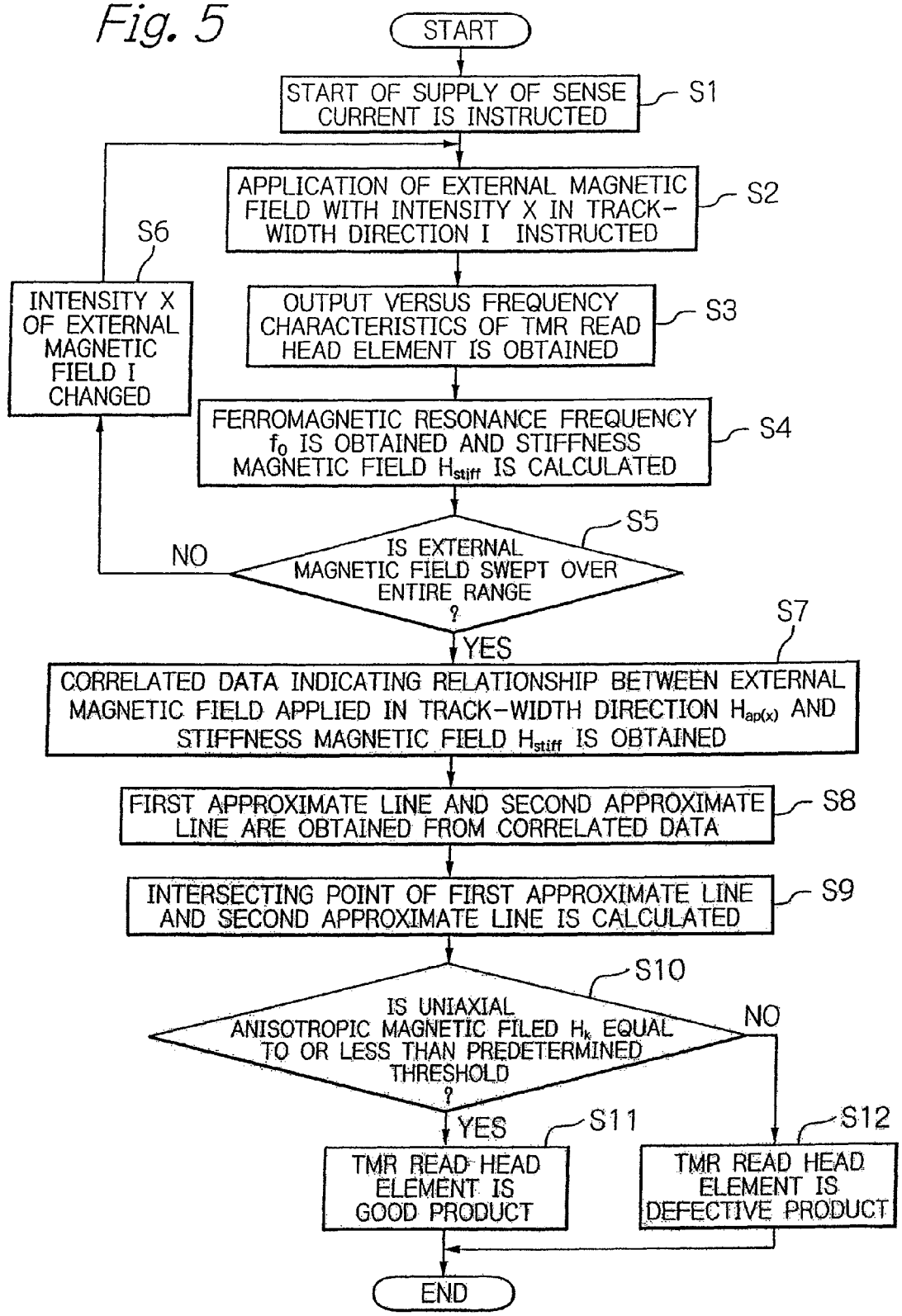
FIG. 5 is a flow chart schematically illustrating a testing procedure in the embodiment shown in FIG. 1.

FIG. 5 schematically illustrates a testing procedure in this embodiment. Hereinafter, with reference to this figure, the testing procedure of the computer 18 in this embodiment will be described.

In the following description, the testing procedure of one thin-film magnetic head is discussed. However, in the actual testing procedure, a plurality of thin-film magnetic heads are sequentially tested to judge whether a row bar of the heads, a wafer of the heads or a lot of the heads is good or not. In that case, output versus frequency characteristics about all of or a predetermined number of the thin-film magnetic heads may be first measured in a lump, and thereafter calculations of ferromagnetic resonance frequencies $f_0$, stiffness magnetic fields $H_{stiff}$ and uniaxial anisotropic magnetic fields $H_k$, and distinctions to see whether good or bad about all of or a predetermined number of the thin-film magnetic heads may be performed in a lump. In a modification, measurement of output versus frequency characteristics, calculation of a ferromagnetic resonance frequency $f_0$, a stiffness magnetic field $H_{stiff}$ and a uniaxial anisotropic magnetic field $H_k$, and distinction to see whether good or bad may be sequentially performed about each thin-film magnetic head. In other modification, measurements of output versus frequency characteristics, calculations of ferromagnetic resonance frequencies $f_0$, stiffness magnetic fields $H_{stiff}$ and uniaxial anisotropic magnetic fields $H_k$, and distinctions to see whether good or bad may be partially and sequentially performed about all of or a predetermined number of the thin-film magnetic heads, and thereafter the remaining part of the processes may be performed.

Before starting the test, the thin-film magnetic head 10 is mounted between the poles 11a of the external magnetic field application device 11 and the probes 13a of the probe device 13 are contacted to the signal electrode terminals 23 (FIG. 2) electrically connected to the TMR read head element 20 of the thin-film magnetic head 10. Then, the testing procedure is started.

First, the computer 18 instructs the sense current source 15 to start supply of a DC sense current with a predetermined level to the TMR read head element 20 (Step S1).

Then, the computer 18 instructs the external magnetic field drive source 12 to apply an external magnetic field with an intensity X in the track-width direction to the thin-film magnetic head 10 (Step S2).

Figure 6:
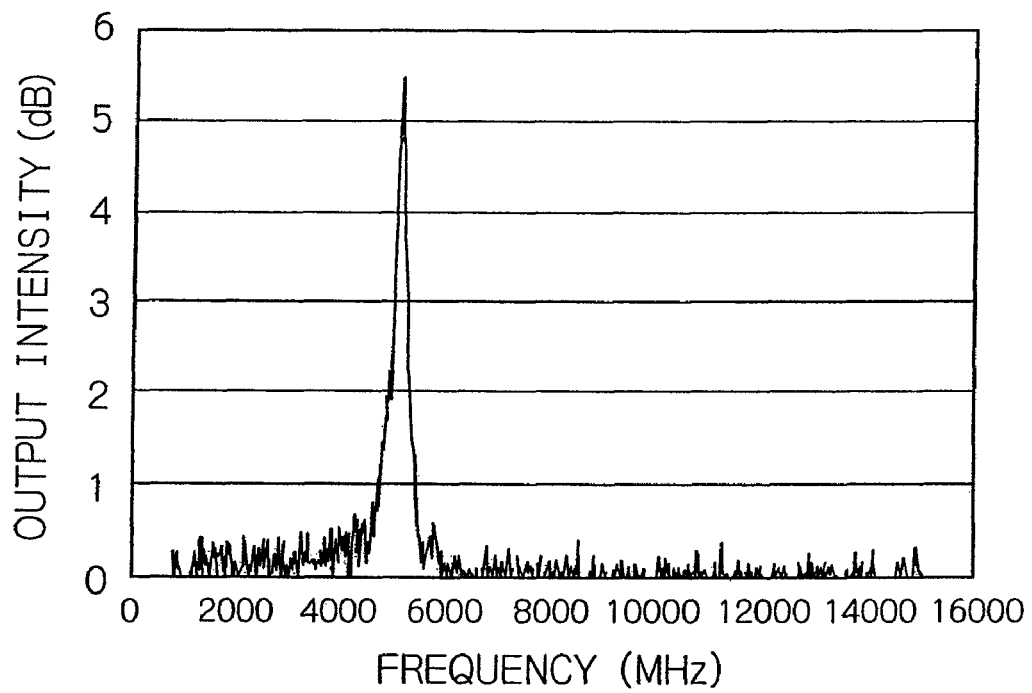
FIG. 6 is a graph illustrating an example of output versus frequency characteristics of the TMR read head element.

Then, the computer 18 receives, from the spectrum analyzer 17, frequency characteristics data of output of the TMR read head element under this state (Step S3). FIG. 6 represents an example of the output versus frequency characteristics of the TMR read head element. In the figure, the lateral axis indicates a frequency (MHz) and the longitudinal axis indicates output intensity (dB).

Then, the computer 18 obtains, from the received output versus frequency characteristics data, a ferromagnetic resonance frequency $f_0$ that corresponds to the maximum value of the output versus frequency characteristics data (namely, determines the ferromagnetic resonance frequency $f_0$ as a frequency at which the received output versus frequency characteristics data becomes the maximum value), calculates a stiffness magnetic field $H_{stiff}$ from the obtained ferromagnetic resonance frequency $f_0$, using a mathematical formula, and stores the calculated values in contrast with the intensities X of the applied external magnetic fields (Step S4). As described even in Klaas B. Klaassen et al., Broad-Band Noise Spectroscopy of Giant Magnetoresistive Read Heads, IEEE TRANSACTIONS ON MAGNETICS, VOL. 41, NO. 7, JULY 2005, it is known that, for an ideal GMR element, the following formula (1) is established between the ferromagnetic resonance frequency $f_0$ and the stiffness magnetic field $H_{stiff}$.

$$f_0 = \frac{\gamma}{2\pi}\sqrt{M_s H_{stiff}} \tag{1}$$

where $\gamma$ is a gyromagnetic constant, and $M_s$ is a magnetic free moment (saturated magnetization) of a free layer, which is determined depending upon a shape of a junction and a thickness of the free layer. Therefore, if the ferromagnetic resonance frequency $f_0$ is obtained, the stiffness magnetic field $H_{stiff}$ can be calculated by using the formula (1).

Then, the computer 18 judges whether the external magnetic field applied is swept over a predetermined entire range of the intensity X or not, that is, whether the intensity of the applied magnetic field is varied from −2500 (Oe) to 1000 (Oe) for example or not (Step S5).

If it is judged that the predetermined entire range has not been swept yet (in case of NO), the intensity X of the applied external magnetic field is changed as X←X+K (K is a constant) for example (Step S6), and then the processes at Steps S2-S5 are executed again.

Figure 7:
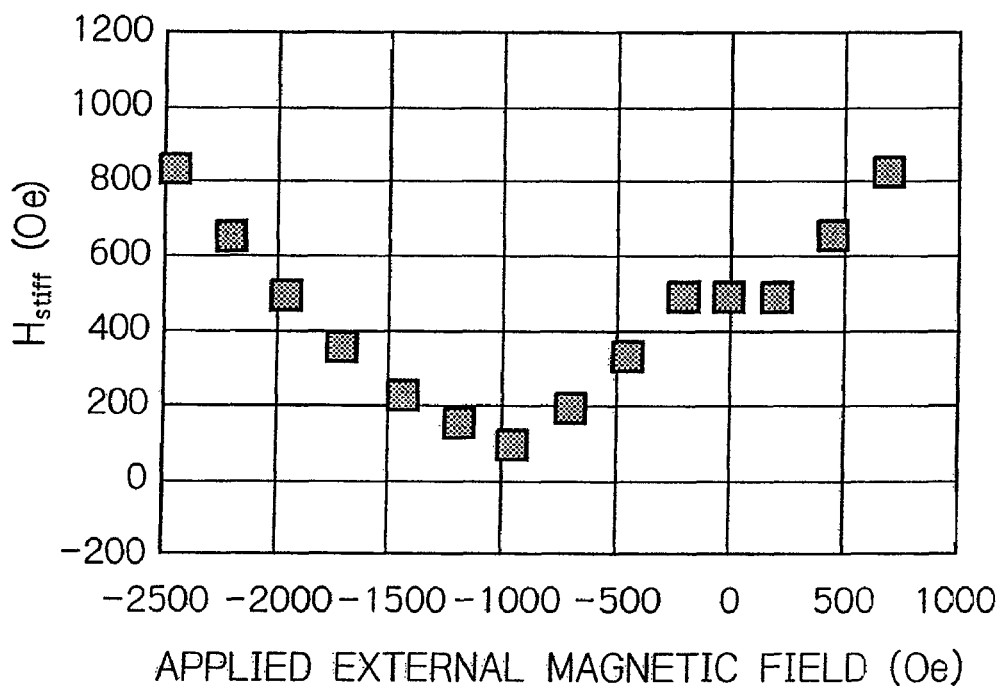
FIG. 7 is a graph illustrating an example of correlated data actually obtained, showing a relationship between an external magnetic field applied in the track-width direction and a stiffness magnetic field $H_{stiff}$.

If it is judged that the predetermined entire range has been swept (in case of YES), the obtained data are arranged to correlated data representing a relationship between the external magnetic field applied in the track-width direction and the stiffness magnetic field $H_{stiff}$ (Step S7). FIG. 7 illustrates an example of the correlated data actually obtained, showing a relationship between the external magnetic field applied in the track-width direction and the stiffness magnetic field $H_{stiff}$. In the figure, the lateral axis indicates the applied external magnetic field (Oe) in the track-width direction and the longitudinal axis indicates the stiffness magnetic field $H_{stiff}$ (Oe).

Thereafter, using the correlated data, a first approximate line is obtained from a linear part of the relationship between the applied external magnetic field and the stiffness magnetic field $H_{stiff}$ when the applied external magnetic field directs the same direction (within the negative gradient region) as that of the bias magnetic field for magnetic domain control, and a second approximate line is obtained from a linear part of the relationship between the applied external magnetic field and the stiffness magnetic field $H_{stiff}$ when the applied external magnetic field directs the opposite direction (within the positive gradient region) as that of the bias magnetic field for magnetic domain control (Step S8).

Then, a value of the stiffness magnetic field $H_{stiff}$ at an intersecting point of the obtained first and second approximate lines is calculated as a uniaxial anisotropic magnetic field $H_k$ (Step S9).

Figure 8:
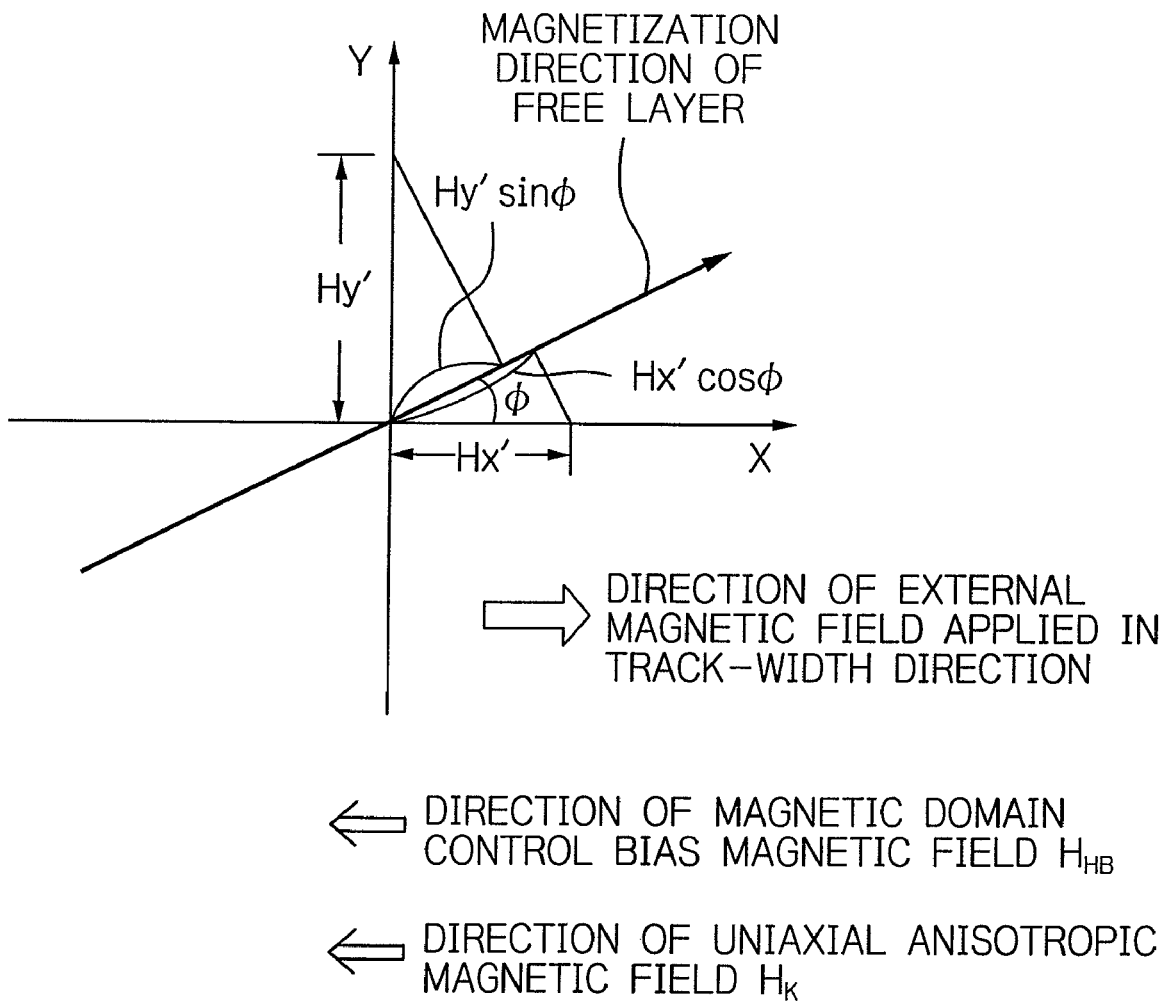
FIG. 8 is a view illustrating a magnetization direction of the free layer, a direction of a uniaxial anisotropic magnetic field $H_k$, and a direction of a bias magnetic field $H_{HB}$ for magnetic domain control, respectively.

As described in Klaas B. Klaassen et al., Broad-Band Noise Spectroscopy of Giant Magnetoresistive Read Heads, IEEE TRANSACTIONS ON MAGNETICS, VOL. 41, NO. 7, JULY 2005, the stiffness magnetic field $H_{stiff}$ can be represented by the following formula (2).

$$H_{stiff} = H_k \cos 2\phi + H_x' \cos \phi + H_y' \sin \phi \quad (2)$$

where $H_x' = H_{ap(x)} + H_{HB}$, $H_y' = H_{ap(y)}$, $\phi$ is a magnetization direction of the free layer with respect to the opposite direction of the bias magnetic field for magnetic domain control, $H_{ap(x)}$ is an applied magnetic field component in a direction along the free layer or X axis direction, $H_{ap(y)}$ is an applied magnetic field component in a direction perpendicular to the free layer or Y axis direction, and $H_{HB}$ is the bias magnetic field for magnetic domain control. FIG. 8 illustrates the magnetization direction of the free layer, the direction of the uniaxial anisotropic magnetic field $H_k$, and the direction of the bias magnetic field $H_{HB}$ for magnetic domain control, respectively. Both the direction of the uniaxial anisotropic magnetic field $H_k$ and the direction of the bias magnetic field $H_{HB}$ for magnetic domain control are the negative direction of Y-axis.

Under a condition where the free layer is magnetically saturated in the same direction as that of the bias magnetic field $H_{HB}$ for magnetic domain control, the following formula (3) is established.

$$H_{stiff} = H_k - H_{HB} - H_{ap(x)} \quad (3)$$

Whereas under a condition where the free layer is magnetically saturated in the opposite direction with respect to that of the bias magnetic field $H_{HB}$ for magnetic domain control, the following formula (4) is established.

$$H_{stiff} = H_k + H_{HB} + H_{ap(x)} \quad (4)$$

Figure 9:
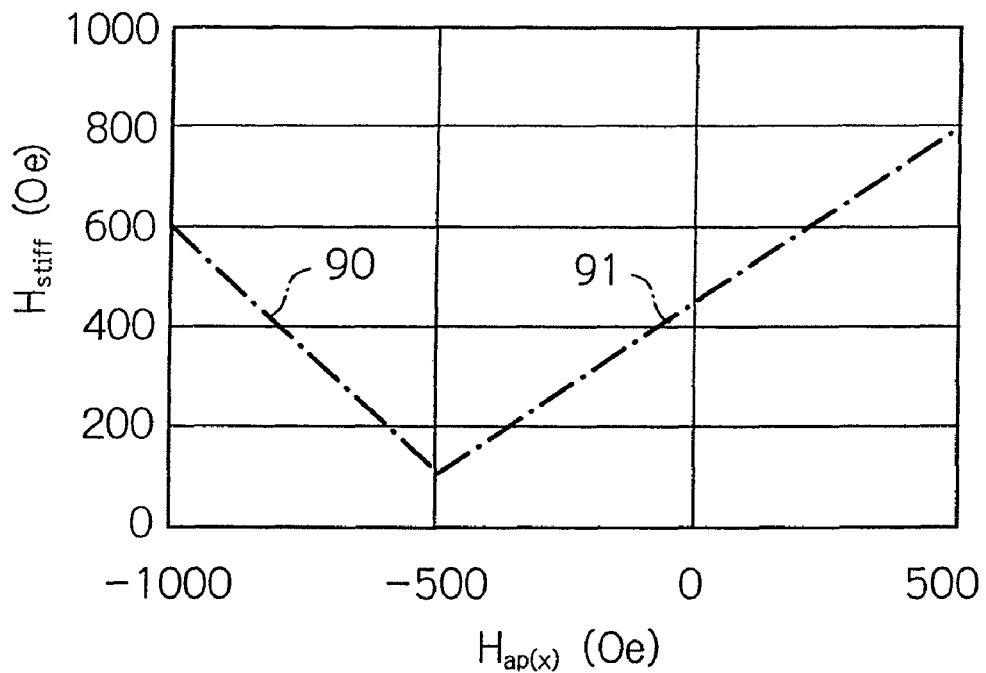
FIG. 9 is a graph illustrating a formula (3) and a formula (4) plotted $H_{ap(x)}$ on the lateral axis, $H_{stiff}$ on the longitudinal axis, respectively.

By plotting $H_{ap(x)}$ and $H_{stiff}$ of the formulas (3) and (4) on the lateral and the longitudinal axes respectively, a first line 90 and a second line 91 can be obtained as shown in FIG. 9. Thus, coordinate at the intersecting point of the first line 90 and the second line 91 is indicated as ($H_{HB}$, $H_k$), and therefore a uniaxial anisotropic magnetic field $H_k$ can be obtained from a value along the longitudinal axis, that is a value of the stiffness magnetic field $H_{stiff}$ at the intersecting point.

Figure 10:
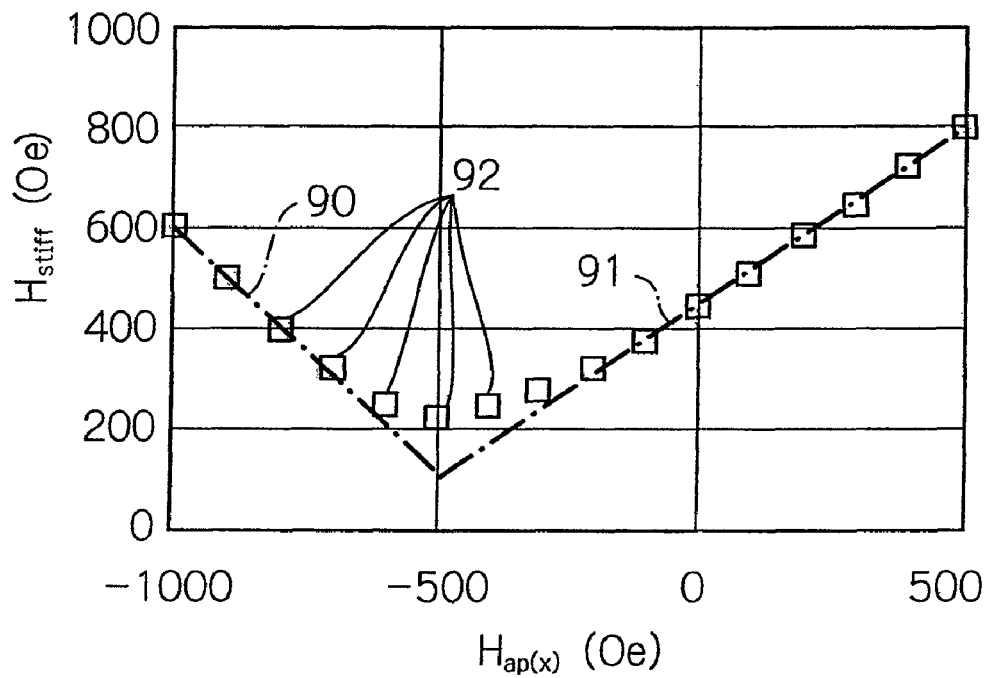
FIG. 10 is a graph illustrating characteristics of the equations (3) and (4) and $H_{stiff}$ data obtained by measurement.

As shown in FIG. 10, sometimes $H_{stiff}$ values 92 obtained by measurement may deviate from the first line 90 or the second line 91. For example, because the magnetization in the free layer may rotate depending upon the composition magnetic field when the applied external magnetic field directs toward the opposite direction as that of the bias magnetic field for magnetic domain control and has substantially the same intensity as the bias magnetic field for magnetic domain control, the $H_{stiff}$ values 92 may sometimes deviate from the lines. In such case, the first line 90 and the second line 91 obtained by extrapolation from the outside have precedence over the $H_{stiff}$ values 92 provided by measurement and then an intersecting point of these lines 90 and 91 is calculated while the $H_{stiff}$ values 92 are ignored.

Thereafter, it is judged whether the uniaxial anisotropic magnetic field $H_k$ obtained in this way is equal to or less than a predetermined threshold or not (Step S10). When the uniaxial anisotropic magnetic field $H_k$ is equal to or less than the predetermined threshold (in case of YES), it is judged that the TMR read head element is a good product (Step S11). Contrary to this, when the uniaxial anisotropic magnetic field $H_k$ is more than the predetermined threshold (in case of NO), it is judged that the TMR read head element is a defective product (Step S12).

Figure 11:
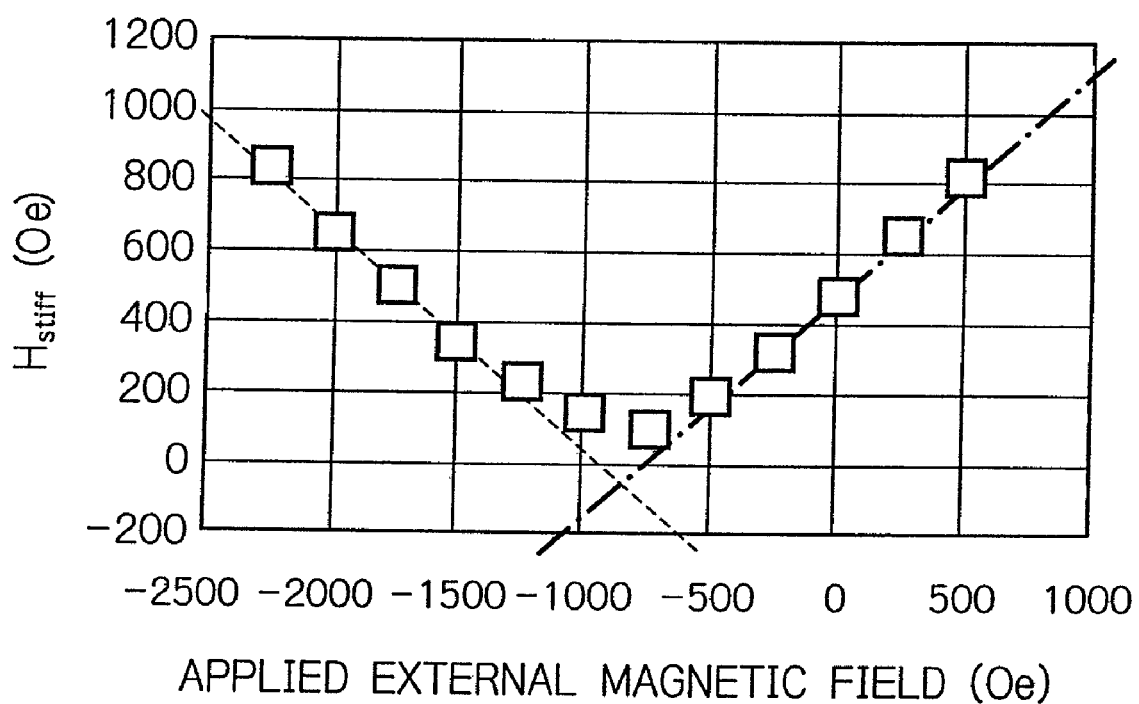
FIG. 11 is a graph illustrating corrected data of the stiffness magnetic field $H_{stiff}$ actually measured, and first and second approximate lines.

FIG. 11 illustrates corrected data of the stiffness magnetic field $H_{stiff}$ actually measured, and first and second approximate lines.

As will be seen from the figure, the actually measured data of stiffness magnetic field $H_{stiff}$ has a region of substantially flat at its value near zero. This is the region where the shield layers of the TMR read head element absorb a part of the applied external magnetic field in the track-width direction. Since the magnetic field absorbed by the shield layers in this element is estimated as about 200 (Oe), the applied external magnetic field indicated in this figure is corrected by this value.

Because a value of the vertical axis at the intersecting point of the first and second approximate lines is −73 (Oe) in this figure, the uniaxial anisotropic magnetic field $H_k$ of the free layer of the TMR read head element is −73 (Oe). As shown in FIG. 8, since a direction of the uniaxial anisotropic magnetic field $H_k$ and a direction of the magnetic domain control bias magnetic field $H_{HB}$ are the same, it is understood that this TMR read head element has an anisotropy of 73 (Oe) in the height direction. It is supposed that a TMR read head element with a negative uniaxial anisotropic magnetic field $H_k$ will have invalid anisotropy against the magnetic domain control bias magnetic field $H_{HB}$. Also, a value of the invalid anisotropy may increase depending upon stress causing characteristic deterioration with the environmental variation. Therefore, such TMR read head has to screen. According to the present invention, such screening can be easily performed.

As aforementioned in detail, according to the present invention, a uniaxial anisotropic magnetic field $H_k$ of the free layer, which cannot be usually watched due to the presence of the magnetic domain control bias magnetic field, can be easily derived. This uniaxial anisotropic magnetic field $H_k$ corresponds to a sum of an inverse magnetostrictive effect by the stress to the free layer and an induced magnetic anisotropy of the free layer material. Thus, an anisotropy of the MR element with a large $H_k$ may greatly change depending upon its stress change and its temperature changes, that is, characteristic change in such MR element depending upon its environmental change may be large. According to the testing method of the present invention, therefore, it is possible to identify an MR element producing noise in response to its environmental variation and having a factor of the device characteristic deterioration can be easily identified, and can be screened.

It should be noted that the embodiment described above relates to a thin-film magnetic head with a TMR read head element, but the present invention can be applicable to a thin-film magnetic head with a GMR read head element or an MR element with other multi-layered structure.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A method for testing a magnetoresistive effect element, comprising the steps of:
    obtaining a ferromagnetic resonance frequency $f_0$ of said magnetoresistive effect element to be tested by applying an external magnetic field in a track-width direction to said magnetoresistive effect element;
    calculating a stiffness magnetic field $H_{stiff}$ from the obtained ferromagnetic resonance frequency $f_0$ using a predetermined formula;
    obtaining a relationship of a stiffness magnetic field $H_{stiff}$ with respect to an external magnetic field applied in the track-width direction from the applied external magnetic field and the calculated stiffness magnetic field $H_{stiff}$;
    obtaining a uniaxial anisotropic magnetic field $H_k$ of a free layer of said magnetoresistive effect element from the obtained relationship of the stiffness magnetic field $H_{stiff}$ with respect to the external magnetic field applied; and
    judging whether said magnetoresistive effect element is good product or not by comparing the obtained uniaxial anisotropic magnetic field $H_k$ with a predetermined threshold.

2. The method as claimed in claim 1, wherein the step of obtaining a ferromagnetic resonance frequency $f_0$ comprises obtaining output versus frequency characteristics of said magnetoresistive effect element and determining the ferromagnetic resonance frequency $f_0$ as a frequency at which the obtained output versus frequency characteristics becomes the maximum value.

3. The method as claimed in claim 1, wherein the step of calculating a stiffness magnetic field $H_{stiff}$ comprises calculating the stiffness magnetic field $H_{stiff}$ using a mathematical formula, $$f_0 = \frac{\gamma}{2\pi}\sqrt{M_s H_{stiff}}$$

where $f_0$ is a ferromagnetic resonance frequency, $\gamma$ is a gyromagnetic constant, and $M_s$ is a magnetic free moment of the free layer, which is determined depending upon a shape of a junction and a thickness of the free layer.

4. The method as claimed in claim 1, wherein the step of obtaining a relationship of a stiffness magnetic field $H_{stiff}$ with respect to an external magnetic field applied comprises changing the external magnetic field applied to said magnetoresistive effect element, and obtaining the ferromagnetic resonance frequency $f_0$ at every time the external magnetic field applied being changed.

5. The method as claimed in claim 1, wherein the step of obtaining a relationship of a stiffness magnetic field $H_{stiff}$ with respect to an external magnetic field applied comprises changing the external magnetic field applied to said magnetoresistive effect element, and not only obtaining the ferromagnetic resonance frequency $f_0$ but also calculating the stiffness magnetic field $H_{stiff}$ at every time the external magnetic field applied being changed.

6. The method as claimed in claim 1, wherein the step of obtaining a uniaxial anisotropic magnetic field $H_k$ comprises obtaining a first approximate line from a linear part of the relationship of the stiffness magnetic field $H_{stiff}$ with respect to the external magnetic field applied when the external magnetic field applied directs the same direction as that of a bias magnetic field for magnetic domain control, obtaining a second approximate line from a linear part of the relationship of the stiffness magnetic field $H_{stiff}$ with respect to the external magnetic field applied when the external magnetic field applied directs the opposite direction as that of the bias magnetic field for magnetic domain control, and obtaining the uniaxial anisotropic magnetic field $H_k$ from an intersecting point of the obtained first and second approximate lines.

7. The method as claimed in claim 1, wherein the step of obtaining a uniaxial anisotropic magnetic field $H_k$ comprises obtaining the uniaxial anisotropic magnetic field $H_k$ from a value of $H_{stiff}$ at an intersecting point of a formula of $H_{stiff}=H_k-H_{HB}-H_{ap(x)}$ under a condition in which the free layer is magnetically saturated in the same direction as that of a magnetic domain control bias magnetic field $H_{HB}$, and a formula of $H_{stiff}=H_k+H_{HB}+H_{ap(x)}$ under a condition in which the free layer is magnetically saturated in the opposite direction with respect to that of the magnetic domain control bias magnetic field $H_{HB}$, where $H_{ap(x)}$ is an applied magnetic field component in a direction along the free layer.

8. The method as claimed in claim 1, wherein the step of judging comprises judging that said magnetoresistive effect element is good product when the obtained uniaxial anisotropic magnetic field $H_k$ is equal to or less than the predetermined threshold.

9. An apparatus for testing a magnetoresistive effect element, comprising:
    means for obtaining a ferromagnetic resonance frequency $f_0$ of said magnetoresistive effect element to be tested by applying an external magnetic field in a track-width direction to said magnetoresistive effect element;
    means for calculating a stiffness magnetic field $H_{stiff}$ from the obtained ferromagnetic resonance frequency $f_0$ using a predetermined formula;
    means for obtaining a relationship of a stiffness magnetic field $H_{stiff}$ with respect to an external magnetic field applied in the track-width direction from the applied external magnetic field and the calculated stiffness magnetic field $H_{stiff}$;
    means for obtaining a uniaxial anisotropic magnetic field $H_k$ of a free layer of said magnetoresistive effect element from the obtained relationship of the stiffness magnetic field $H_{stiff}$ with respect to the external magnetic field applied; and
    means for judging whether said magnetoresistive effect element is good product or not by comparing the obtained uniaxial anisotropic magnetic field $H_k$ with a predetermined threshold.

10. The apparatus as claimed in claim 9, wherein the means for obtaining a ferromagnetic resonance frequency $f_0$ comprises means for obtaining output versus frequency characteristics of said magnetoresistive effect element and means for determining the ferromagnetic resonance frequency $f_0$ as a frequency at which the obtained output versus frequency characteristics becomes the maximum value.

11. The apparatus as claimed in claim 9, wherein the means for calculating a stiffness magnetic field $H_{stiff}$ comprises means for calculating the stiffness magnetic field $H_{stiff}$ using a mathematical formula, $$f_0 = \frac{\gamma}{2\pi}\sqrt{M_s H_{stiff}}$$

where $f_0$ is a ferromagnetic resonance frequency, $\gamma$ is a gyromagnetic constant, and $M_s$ is a magnetic free moment of the free layer, which is determined depending upon a shape of a junction and a thickness of the free layer.

12. The apparatus as claimed in claim 9, wherein the means for obtaining a relationship of a stiffness magnetic field $H_{stiff}$ with respect to an external magnetic field applied comprises means for changing the external magnetic field applied to said magnetoresistive effect element, and means for obtaining the ferromagnetic resonance frequency $f_0$ at every time the external magnetic field applied being changed.

13. The apparatus as claimed in claim 9, wherein the means for obtaining a relationship of a stiffness magnetic field $H_{stiff}$ with respect to an external magnetic field applied comprises means for changing the external magnetic field applied to said magnetoresistive effect element, and means for not only obtaining the ferromagnetic resonance frequency $f_0$ but also calculating the stiffness magnetic field $H_{stiff}$ at every time the external magnetic field applied being changed.

14. The apparatus as claimed in claim 9, wherein the means for obtaining a uniaxial anisotropic magnetic field $H_k$ comprises means for obtaining a first approximate line from a linear part of the relationship of the stiffness magnetic field $H_{stiff}$ with respect to the external magnetic field applied when the external magnetic field applied directs the same direction as that of a bias magnetic field for magnetic domain control, means for obtaining a second approximate line from a linear part of the relationship of the stiffness magnetic field $H_{stiff}$ with respect to the external magnetic field applied when the external magnetic field applied directs the opposite direction as that of the bias magnetic field for magnetic domain control, and means for obtaining the uniaxial anisotropic magnetic field $H_k$ from an intersecting point of the obtained first and second approximate lines.

15. The apparatus as claimed in claim 9, wherein the means for obtaining a uniaxial anisotropic magnetic field $H_k$ comprises means for obtaining the uniaxial anisotropic magnetic field $H_k$ from a value of $H_{stiff}$ at an intersecting point of a formula of $H_{stiff}=H_k-H_{HB}-H_{ap(x)}$ under a condition in which the free layer is magnetically saturated in the same direction as that of a magnetic domain control bias magnetic field $H_{HB}$, and a formula of $H_{stiff}=H_k+H_{HB}+H_{ap(x)}$ under a condition in which the free layer is magnetically saturated in the opposite direction with respect to that of the magnetic domain control bias magnetic field $H_{HB}$, where $H_{ap(x)}$ is an applied magnetic field component in a direction along the free layer.

16. The apparatus as claimed in claim 9, wherein the means for judging comprises means for judging that said magnetoresistive effect element is good product when the obtained uniaxial anisotropic magnetic field $H_k$ is equal to or less than the predetermined threshold.

* * * * *